United States Patent

[19] Hottinen

[11] Patent Number: 6,047,020
[45] Date of Patent: Apr. 4, 2000

[54] RECEIVING METHOD AND A RECEIVER

[75] Inventor: Ari Hottinen, Vantaa, Finland

[73] Assignee: Nokia Telecommunications OY, Espoo, Finland

[21] Appl. No.: 08/952,057
[22] PCT Filed: Mar. 18, 1997
[86] PCT No.: PCT/FI97/00176
§ 371 Date: Nov. 7, 1997
§ 102(e) Date: Nov. 7, 1997
[87] PCT Pub. No.: WO97/35384
PCT Pub. Date: Sep. 25, 1997

[30] Foreign Application Priority Data

Mar. 19, 1996 [FI] Finland ................................ 961271

[51] Int. Cl.[7] .................................................. H04B 15/00
[52] U.S. Cl. .......................... 375/207; 375/206; 375/349; 370/342; 370/344; 370/347
[58] Field of Search ............................. 342/159; 375/200, 375/206, 207, 208, 209, 210, 254, 346, 348, 349, 350; 395/75; 706/43, 59; 370/335, 342, 349, 441, 344

[56] References Cited

U.S. PATENT DOCUMENTS

| 5,625,829 | 4/1997 | Hong .......................................... 395/75 |
| 5,706,013 | 1/1998 | Melvin et al. .......................... 342/159 |
| 5,715,279 | 2/1998 | Laakso et al. ............................ 375/224 |
| 5,761,237 | 6/1998 | Petersen et al. ........................ 375/200 |

FOREIGN PATENT DOCUMENTS

| 465 851 | 1/1992 | European Pat. Off. . |
| 493 904 | 7/1992 | European Pat. Off. . |
| 641 100 | 3/1995 | European Pat. Off. . |
| 711 044 | 5/1996 | European Pat. Off. . |
| 95 24086 | 2/1994 | WIPO . |

OTHER PUBLICATIONS

P. Huber, Projection Pursuit, Annals of Statistics, vol. 13, No. 2, pp. 435–475, 1985.

J. Friedman, Exploratory projection pursuit, J. American Statistical Association, vol. 82, No. 397, pp. 249–266, Mar. 1987.

Hottinen: "Self–Organizing Multiuser Detection", IEEE, 1994, pp. 152–156.

Verdu:. "Adaptive Multisuer Detection", Department of Electrical Engineering, Princeton University, pp. 43–50.

*Primary Examiner*—Stephen Chin
*Assistant Examiner*—Chieh M. Fan
*Attorney, Agent, or Firm*—Pillsbury Madison & Sutro

[57] ABSTRACT

A method and a receiver in a system in which received signals are composed of a number of summed signal components of which at least some are unknown, and in which the receiver has components for sampling the received signal to produce samples and forming an information vector of the samples, components for estimating the received signals with one or more multidimensional filters, components for forming a model of the received signal by a cost function which reveals non-linearities in the signal, and for optimizing the filter function, and components for detecting data contained in the samples of the received signal by means of the optimized filter functions so that prior to the detection the dimension of the information vector is reduced.

13 Claims, 2 Drawing Sheets

RECEIVING METHOD AND A RECEIVER

This application is the national phase of international application PCT/FI97/00176, filed Mar. 18, 1997 which designated the U.S.

FIELD OF THE INVENTION

The invention relates to a receiving method in which a received signal comprises several summed signal components, at least some of which being unknown, and the received signal being sampled, said samples forming an information vector, and in which the received signals are estimated with one or more multidimensional filters.

PRIOR ART

In planning and implementing communication systems, one of the fundamental problems is concurrent transmission and reception of signals by several simultaneous users so that the signals would interfere with one another as little as possible. For the above reason, and because of other interference caused by the transmission channel, as well as the transmission capacity being employed, a number of different transmission protocols and multiple access methods have been developed. Particularly in mobile communication systems, the most common of these include the FDMA and TDMA methods, and lately also the CDMA method.

In all the above methods, interference is present in somewhat different forms, and different kinds of methods have been employed in these methods to overcome interference-related problems. In TDMA, a significant source of interference is intersymbol interference (ISI), and in CDMA, multiple access interference (MAI). Generally speaking, in detection of a desired signal, the aim is to find the desired symbols in a signal to which surplus information has been summed. The different multiple access methods pursue this aim in different ways. For CDMA, simultaneous detection of a plurality of users, and for TDMA different types of equalizers have been suggested.

The equalizers, which seek to alleviate signal distribution in time domain, come in two basic types: linear and non-linear. The linear equalizers, such as Wiener filters, are simple to implement but do not perform well enough in all situations due to a modulated waveform being characteristically non-linear. Non-linear equalizers are represented by e.g. a Viterbi equalizer and decision-feedback equalizers.

Correspondingly in the CDMA, the MUD methods are either linear or non-linear. Of the former, a decorrelating receiver, and of the latter, a Viterbi and decision feedback coupling method may be mentioned. A closer description of decorrelating receivers may be found in e.g. A. Hottinen: Self-organizing multiuser detection, Proc. of IEEE ISSSTA '94, Oulu, Finland.

Also known in prior art is the use of so-called blind adaptive algorithms in the equalizers and detection. A blind algorithm refers to a adaptation rule that does not take into account the polarities of the signals, i.e. a training sequence is not required to bring the receiver in a correct state. Blind methods are described in association with CDMA, for example in the reference S. Verdu: Adaptive multiuser detection, Proc. of IEEE ISSSTA '94, Oulu, Finland.

All the above methods, including the non-linear ones, share the drawback that as the number of interfering signals increases, which means that the dimension of the computation space increases, a steep increase occurs in the computation amount required for carrying out optimal detection. As the optimal detection has thus turned out to be difficult, suboptimal methods have been employed, which has resulted in loss of received information, manifest at the detector as deteriorated signal quality.

CHARACTERISTICS OF THE INVENTION

It is consequently an object of the present invention to implement a method by means of which a received signal containing interference may be detected suboptimally even in case the signal model is unknown. The invention further aims at implementing an adaptive method which requires little information on the interfering signals and noise and which is able to detect the desired signal reliably with a smaller amount of information even in a disturbed propagation environment.

These objects are achieved by a method of the type set forth in the introduction, characterized in that signal filtering takes place adaptively by forming a model for the signal by means of a cost function which reveals non-linearities in the signal and which is used in optimizing a filter function, and that the data are detected by means of the optimized filter functions so that prior to the detection the dimension of the information vector is reduced.

The invention further relates to a receiver in a system in which received signals comprise a number of summed signal components of which at least some are unknown, and the receiver comprising a means for sampling the received signal and forming an information vector of the samples, and a means for estimating the received signals with one or more multidimensional filters. The inventive receiver is characterized by comprising a means for forming a model of the signal by means of a cost function which reveals non-linearities in the signal and for optimizing the filter function, and a means for detecting the data by means of the optimized filter functions so that prior to the detection the dimension of the information vector is reduced.

The method and receiver according to the invention provide a multitude of advantages. The receiving method of the invention employs so-called projection pursuit, and it is capable of efficiently removing the effects of intersymbol interference and multiple access interference, and in general nonlinear interference in the signal to be detected. It is applicable in connection with FDMA, TDMA as well as CDMA. It may further be used in a multi-stage receiver as one of the latter stages. For example, in connection with the CDMA, a conventional receiver stage implemented by filters adapted to spreading codes may serve as the first receiver stage the output signal of which is processed by the receiver stage according to the invention. A large amount of computation associated with the prior art methods may in the solution of the invention be avoided by restricting estimation to some of subspaces chosen, without, however, losing any significant information. Further still, the method makes it possible not to use a correlator in the multistage detector for the interfering users.

As mentioned, the solution according to the method of the invention utilizes a so-called projection pursuit method which may be used for finding the ideal filters required for signal processing. The projection pursuit scheme applies a general projection index, i.e. a cost function, used to find a subspace indicating the most significant features of a signal. According to the method, the receiver further finds a number of subspaces that together collect information on a time or code correlated signal, this information being utilized in the detection. The projection pursuit method is known per se in statistics, and it is described e.g. in P. Huber: Projection Pursuit, Annals of Statistics, Vol. 13, No. 2, pp. 435–475, 1985, which is herein incorporated as reference. It should be noted that the solution according to the invention applies projection pursuit in a new way in a telecommunications context in which the method is used to detect the nonlinear features of a signal.

BRIEF DESCRIPTION OF THE DRAWINGS

In the following, the invention will be described in closer detail with reference to the examples in the accompanying drawings, in which.

DESCRIPTION OF THE PREFERRED EMBODIMENTS

Figure 1:
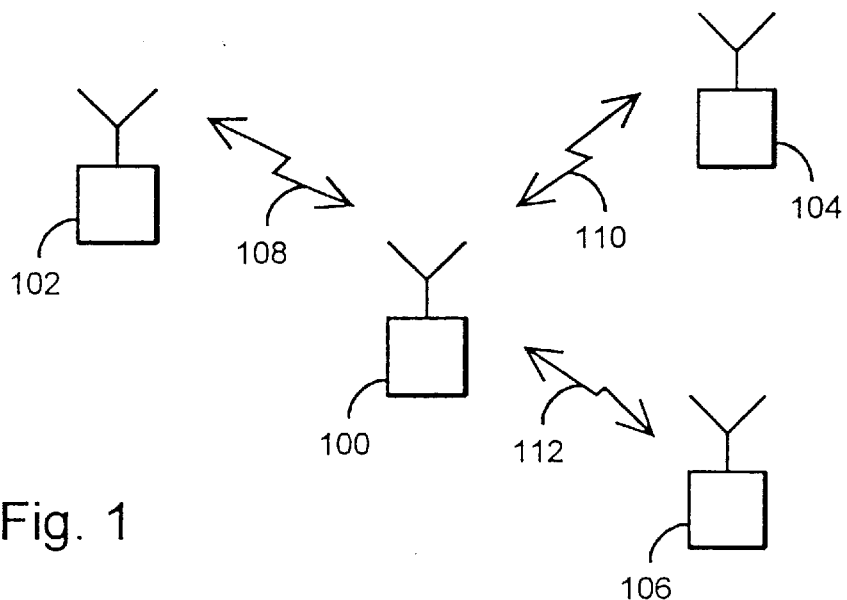
FIG. 1 illustrates a cellular radio system in which the method according to the invention may be applied.

FIG. 1 is an exemplary illustration of a typical cellular radio system in which the receiving method according to the invention may be applied. In this exemplary case, a CDMA system is employed but the invention is applicable to the other multiple access methods, as is obvious for a person skilled in the art.

The system comprises a base station 100 and a number of subscriber terminals 102–106 which have a connection 108–112 to the base station. In case of a CDMA system, all the subscriber terminals 102–106 communicate with the base station 100 on the same frequency band. The transmissions from the terminal equipments are distinguished by a pseudo-random spreading code. Although the aim is to choose the spreading codes used on the different connections so that in an ideal case they do not correlate with each other, i.e. do not interfere with each other, in practice the other connections are, during reception of the desired signal, perceived as multiple access interference. The interference may originate either from the same or surrounding cells. The method of the invention is applicable to the receiver of both the base station and the terminal equipment.

In the following, an exemplary description is at first offered of an asynchronous CDMA system in which the method of the invention may be applied. As is obvious for a person skilled in the art, the invention may also be applied to a synchronous system.

It is assumed that there are K users in an asynchronous BPSK CDMA system, each having been assigned the spreading waveform $$s_k(t) = \sum_{j=1}^{N} S_k^{(j)} \prod_{T_c}(t - jT_c)$$

in which the jth chip, i.e. bit, of the spreading waveform for the kth user is obtained from $$S_k^{(j)} \in \{-1,1\}, k=1, \ldots, K.$$

In the above, $T_c$ is the chip length and N signifies the number of chips in the spreading waveform. No restrictions are set for a user's spreading code. The users transmit the information by modulating the spreading waveforms with the data symbols $b_k^{(j)} \in A$ in which A is a symbol alphabet, in the case of BPSK $\{-1,1\}$. In CDMA, then, all the users transmit simultaneously on the same frequency. It is therefore the task of the receiver to demodulate the summed signal $$r(t) = \sum_{k=1}^{K} \sum_{i=-P}^{P} h_{k(t)} * b_k^{(i)} \sqrt{\frac{E_k}{T}} s_k(t - iT) + n(t)$$

where n(t) represents white Gaussian noise at which the power spectral density $N_0/2$, 2P+1 denotes the length of the data packet, $h_k(t)$ denotes the impulse response of the kth user's physical channel, $E_k$ denotes the transmission power of the kth user. The symbol * denotes convolution. The signal propagates through a multipath channel, and the impulse response $h_k(t)$ of the channel may be represented by the formula $$h_k(t) = \sum_{l=0}^{L} h_{k,l}(t)\sigma(t - \tau_{k,l})$$

where the lth channel coefficient, i.e. the channel tap, of the kth user is $h_{k,l} \in C$ and $\tau$ is the corresponding delay. When the coefficient is time-varying with Rayleigh distributed amplitudes, the channel is called a Rayleigh channel. When $h_{k,l}$ is constant, the channel is referred to as a Gaussian channel (assuming that the noise n(t) is Gaussian noise).

The receiver receives the signal r(t), and correlates the signal with a receiver filter $w_k(l)$, i.e.

$$z_{k,l}^{(i)} = \int_{iT+\tau_{k,l}}^{(i+1)T+\tau_{k,l}} r(t) w_{k,m}^*(t - \tau_{k,l} - iT) dt$$

where T denotes the length of the symbol interval. In CDMA, the filter is typically matched to the transmitted waveform, $w_k \equiv s_k$.

In order to build a matrix model of the received signal, the outputs of the kth user's matched filters are collected to the vector $$z_k^{(i)} = (z_{k,l}^{(i)}, \ldots, z_{k,l}^{(i)})$$

the outputs of all K users' filter outputs to $$z^{(i)} = (z_l^{(i)}, \ldots, z_K^{(i)})$$

and finally a sequence of matched filter outputs to $$z = (z^{-P}, \ldots, z^{P})^T$$

The amplitude related to the ith symbol of the kth user's lth path is denoted with $\alpha_{k,l}^{(i)}$. The amplitudes $$a_{k,l}(t) \equiv \sqrt{\frac{E_k}{T}} h_{k,l}$$

are assumed to be constant during a symbol interval, and $$\alpha_{k,l}^{(i)} = \alpha_{k,l}(t), iT \leq t < (i+1)T$$

The amplitudes of the kth user's channel coefficients at the ith time interval are collected to $$\alpha_k^{(i)} = (\alpha_{k,l}^{(i)}, \ldots, \alpha_{k,L}^{(i)})^T.$$

The matrix of amplitudes for signals received by all K users is determined as $$A^{(i)}=diag(\alpha_1^{(i)},\ldots,\alpha_K^{(i)})$$

The correlation between the kth user's lth multipath component and the k'th user's l'th multipath component is obtained from $$\left[R_{k,k'}^{(n)}\right]_{l,l'} = \int_{-\infty}^{\infty} w_k(t - \tau_{k,l}) s_{k'}^*(t - \tau_{k',l'} + nT)\,dt$$

By collecting these to matrices $$R^{(n)} = \begin{bmatrix} R_{1,1}^{(n)} & \cdots & R_{1,K}^{(n)} \\ \vdots & \ddots & \vdots \\ R_{K,1}^{(n)} & \cdots & R_{K,K}^{(n)} \end{bmatrix}$$

and $$R_N = \begin{bmatrix} R^{(o)} & \cdots & R^{(2N)} \\ \vdots & \ddots & \vdots \\ R^{(-2N)} & \cdots & R^{(o)} \end{bmatrix}$$

the received signal may be written in the form $$z=RAb+n,$$

where $R=R_{Ns}$, $A=diag(A^{(-2Ns)},\ldots,A^{(2Ns)})$ and $b=(b^{(-Nw)},\ldots,v^{(Nw)})^T$, where $b^{(i)}=(b_1^{(i)}1^T,\ldots,b_K^{(i)}1^T)$. Here, Ns represents a sliding window dimension such that when solving for symbol i, N symbols before and after i are taken into account; for vbbit, or symbol, i, detection is performed using $(i-Nw),\ldots,i,\ldots(i+Nw)$; and $l=(1,\ldots,1)^T$ is an L vector. The noise is assumed Gaussian with covariance R.

The parameters of the received signal, i.e. the delays and amplitudes, are estimated in the receiver, and assuming that the signal has propagated in a Gaussian channel, the prior art parametric detectors, such as ML (Maximum Likelihood), solve $$b_{opt}=\arg\min |z-Rab|_c^2,$$

where $|y|_c^2=y^H Cy$ and C is the weighting matrix. Here, $c=(R+\delta^2 A)^{-1}$, where $\delta$ is a regulating parameter that sets a greater weight on the diagonal of the matrix; if R is nonsingular then $\delta$ will be zero and if R is singular then with the aid of $\delta$, R can still be inverted.

According to the formulas above, a prior art receiver detects the desired signal from among interfering signals, providing the computation load does not increase too much or the signal model is known. The method according to the invention is particularly well applicable in case the model is known in part only (a submatrix of R) or if the noise is not Gaussian distributed.

In the following, the adaptive method according to the invention will be described. It should be noted that almost all receivers are adaptive to some extent. Different adaptive features are determined by which information the receiver assumes to know of the signal a priori, what it has to learn about the received signal, and what it will do with the information learned. The solution according to the invention is based on the statistical decision theory having its foundation on a criterion that is dependent on the probability density function of the signal. If the receiver knows the density function, it is able to make an optimal decision on the basis of e.g. ML, MAP (Maximum A Posteriori) or a general Bayesian criterion. A key feature of the invention is that the probability density functions are estimated directly from the received signal.

In the projection pursuit method, the estimated signal is processed with one or more multidimensional filters, and by means of the cost function the receiver adaptively finds filter functions for the received signal, the cost function distinguishing nonlinear features, such as non-Gaussian features or clusters, in the signal. The receiver typically consists of several stages, each stage being able to carry out dimension reduction and signal detection. The detector may be implemented by various ways, for example by nonparametric density estimation. The nonparametric method may efficiently be implemented by utilizing Fourier transformation (FFT).

Figure 2:
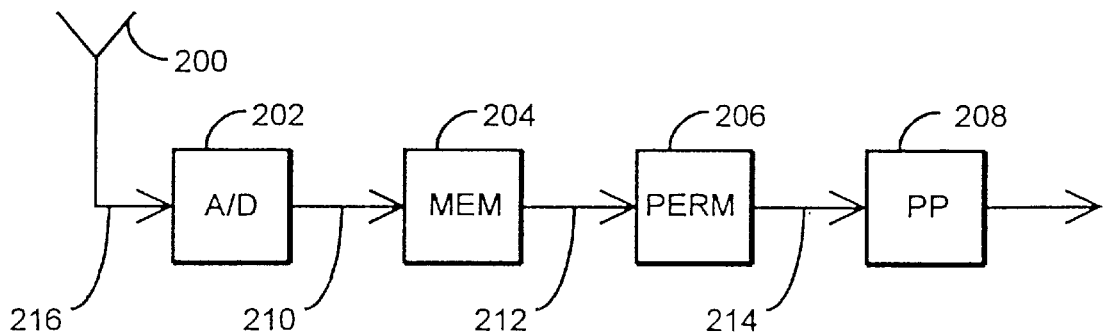
FIG. 2 is an exemplary illustration for the structure of a receiver implementing one of the embodiments of the invention.

FIG. 2 is a block diagram illustration of a simplified structure for the front end of a receiver implementing one of the embodiments of the invention. By means of a radio frequency means (not shown), transducing means 202 are operationally connected to an antenna 200. The received signal 216 is applied to a converter 202 which converts the signal to digital form by sampling it at a desired sampling frequency. The sampled signal 210 is applied to a memory element 204. The samples are read out from the memory element 204, and are fed to a signal processing processor 206 which performs a linear transformation to the signal, e.g. permutation, interleaving, preliminary dimension reduction, or decoding. The permutation may be the inverse function of the permutation performed e.g. at the transmitting stage. Samples may be taken out from the processing means 206 at a desired rate. Dimension reduction may be performed so that the output rate of the processing means is lower than the input rate. However, the memory element 204 and the processing means 206 are not mandatory, and the solution according to the invention may also be implemented without them.

From the processing means 206, the signal 214 is applied to a projection pursuit means 208 which processes, detects, and estimates the constituent symbols either parametrically or nonparametrically, or their combination. Nonparametric estimation refers to a method in which no initial assumption is made of the signal model or the interference source, or of the density estimate. The latter way is inefficient in high dimensions, and therefore subspace estimation is used for dimension reduction. As a person skilled in the art will know, the inventive receiver also comprises other components, such as filters. For reasons of clarity, these components are not dealt with here as they are inessential from the point of view of the invention.

Assuming that $\{P_m\}$, $m=1,\ldots,M$ is a set of projection operators to subspaces $\{L_m \in C^{dm}\}$, $m=1,\ldots,M$, $d=1,\ldots,D$ and d denotes dimension. Here, the subspaces may be of different dimensionality, and may be implemented by a set of ed,, filters that may be adaptive or fixed. The method may be described with the aid of the following steps:

Find a set of low dimensional subspaces from the received signal given, by using suitable criteria or cost function.

Estimate statistics of signal $r_i$ in the low dimensional space (density or the parameters of the density).

Remove the information in the low dimensional space (by using previously estimated functions or/and parameters for transformation of signal) to obtain processed signal $r_{i+1}$.

Combine the statistics from the previous dimensions and receiver stages.

Go back to step 2.

Figure 3:
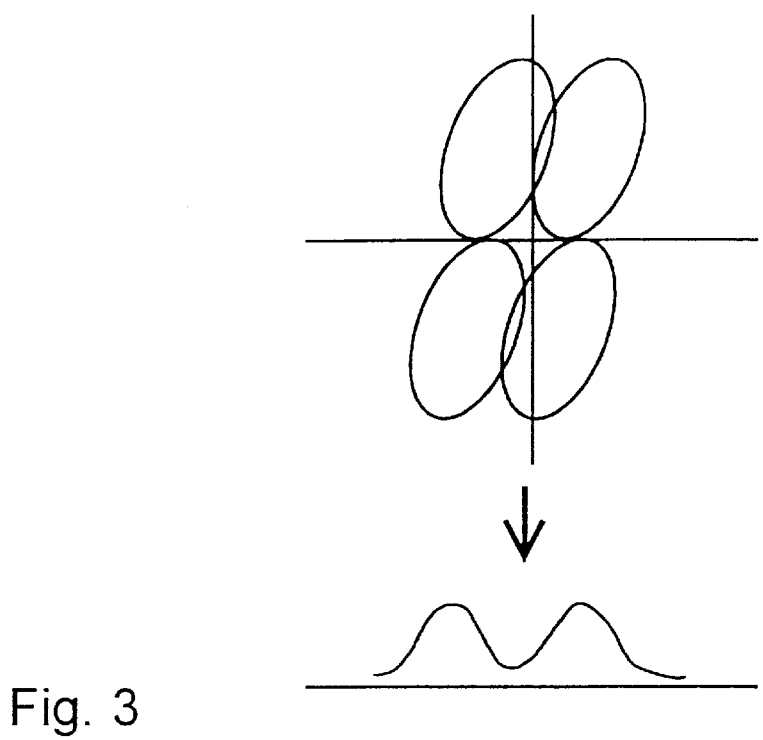
FIG. 3 illustrates projecting a set of BPSK signals on an x-axis.

What is essential, then, is to find the low dimensional subspace L. The cost function used in the projection pursuit method of the invention reveals nonlinear features in the information. Typical non-linear features (non-Gaussian signals) are formed e.g. in the modulated data. To take an example, when the set of BPSK signals is projected to the x-axis, a clustered data set is formed because it is a combination of two Gaussian distributed distributions with different means. This is illustrated by FIG. 3. The same principle applies in higher dimensions as well. In the communication context, higher dimensions are formed when the data is spread e.g. in time according to channel impulse response, or in symbol domain (like in CDMA).

Projection pursuit provides means for collecting information from the multidimensional signal by finding characteristic features of the signal and by combining them effectively. The features are revealed by filters optimized adaptively by using cost functions different from the ones typically used in communications contexts.

The cost function should be defined so as to reveal the interesting features of the signal. There are two basic ways to choose the cost function: the statistical features of the density (e.g. moments, cumulants) or the density estimate as such. The density, in turn, may be estimated from the statistics or functions of the statistics by parametric density estimation, or directly from the samples by non-parametric density estimation.

Many distance measures between densities may be employed as cost functions. One of them is the so-called F-divergence. F-divergence may be used as the cost function in an adaptive projection pursuit receiver.

For example, if $f(u)=u\log(u)$, then $$F_{ulogu} = \int p_1 \log\left(\frac{p_1}{p_2}\right) d\lambda$$

where $p_1$ and $p_2$ are densities, whereby the F-divergence is the same as the Kullback-Leibner distance.

To take another example, if $f(u)=|1-u^{1/p}|^p$, then $$H_p = \int |p_1^{1/p} - p_2^{1/p}|^p d\lambda$$

whereby the F-divergence coincides with Hellinger distance.

Other measures may also be used as cost function, depending on the features to be revealed from the signal. Such other measures are described in the aforementioned publication by P. Huber.

If particularly the CDMA system and multiuser detection are examined, the non-Gaussian features of the signal can be seen e.g. in the residual signal from which the effect of known interference has been cancelled. It is possible to estimate the effects of unknown interference by means of a suitable cost function on the basis of the nonlinearity caused by the interference. Hence, interference cancellation may be carried out without having to detect the interfering bits.

In the following, the projection pursuit method according to the invention is examined with the aid of another example. The desired subspace is assumed to be $L_{max}$ and the corresponding projection matrix $P_{max}$. It is further assumed that M samples have been stored in the matrix $z=(z^{(1)}, \ldots, z^{(M)})$. m denotes the so-called kernel, i.e. the probability density function. In order to determine the subspace, it is first necessary to determine the cost function Q(.) that finds the desired features. In case of nonlinearities, the cost function Q should be invariant to affine transformations, $Q_1(AZ+m)=Q_1(Z)$. An affine transformation refers to the combined result of one or more parallel projections. This cost function class is able to capture higher order features of the data. Cost functions that satisfy $Q_2(AZ+m)=AQ_2(Z)+m$ are suitable for extracting first order information (mean, location), and the ones that satisfy $Q_3(AZ+m)=AQ_3(Z)$ are sensitive to second order information (covariance).

The following exemplary algorithm illustrates the use of projection pursuit. Denote $Z(0)\equiv Z$ and $Q(.)\equiv Q_1$. $\Gamma$ is an unknown d-dimensional probability density function, (1) Set $Z(i+1)=$Whiten $(Z(i))$.
(2) Solve $P_{max}(i)=\text{argmax}_P Q(PZ(i+1))$.
(3) Set $Y(i+1)=P_{max}Z(i+1)$.
(4) Update the model $\Gamma_{i+1}=\Gamma_i h_{i+1}(Y(i+1))$
(5) Generate a sample from the new model $z(i+1)\sim\Gamma_{i+1}$.
(6) Go to step 1.

Step 1 is optional and does not affect the optimization for the selected cost function class. The whitening provides the advantage that all marginal densities will have variance 1, and only the higher order information remains in the data. This is useful in implementing step 2 for computational reasons. Steps 1 and 5 may be implemented in many ways. For example, a Monte Carlo sample may be taken from the new model as in analytical projection pursuit, or the new sample may be taken by using a non-linear transformation. The interference cancellation step in the multistage detector provides one non-linear method for Gaussinizing the data. The residual signal z-Rab(m) of the interference cancellation is Gaussian with zero mean if the interference cancellation succeeded.

The projection pursuit scheme may be used for finding, from multidimensional data, such a projection level at which the signal is non-Gaussian, and in the subspace in question the data may be Gaussinized by a decision-feedback coupling, as in interference cancellation, by the Monte Carlo method or non-linear transformation. This is explained e.g. in J. Friedman: Exploratory projection pursuit, J. American Statistical Association, Vol. 82, No. 397, pp. 249–266, March 1987.

Figure 4:
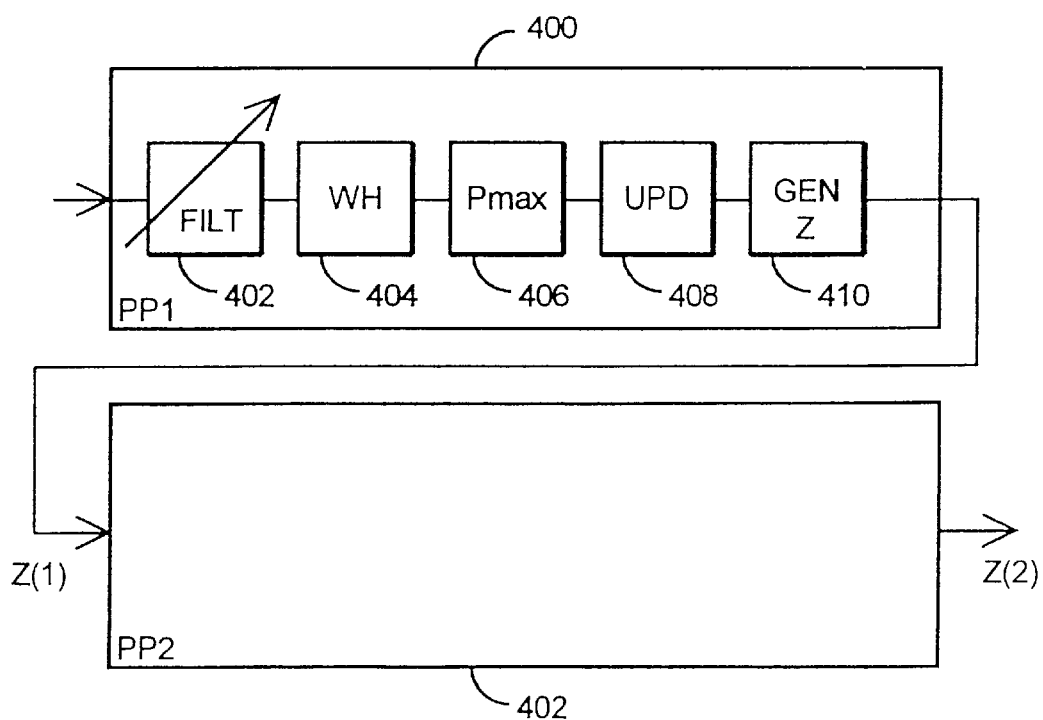
FIG. 4 illustrates an example of implementing projection pursuit.

In the following, the implementation of the algorithm described above is examined in the receiver by means of the block diagram in FIG. 4. The figure shows how a signal is applied, in the first stage 400 of the projection pursuit, first to an adaptive filter 402, which may be implemented e.g. on the rake principle. From the filter, the signal is applied to a processor 404, in which signal whitening is performed. The whitened signal is applied to a processor 406, which finds non-linear features, i.e. computes $P_{max}$. Next, the density estimate is updated in a processor 408 and a sample is generated from the new model in a processor 410. The sample z(1) thus obtained is applied to the second stage 402, is which the procedure is repeated, and a new sample z(2) is obtained, etc. The aforementioned processors may naturally be replaced in practice with one signal processor into which the algorithm required has been stored. As far as the invention is concerned, the whitening mentioned above in block 404 is not essential. The estimate for the density function is corrected on the basis of data $z(0), z(1), \ldots, z(n)$.

As known, detection generally relates to recognizing user bits among external interference in the received signal. The detection is based on the signal z and the estimated density from successive sequences $z_1, \ldots, z_M$. After the densities have been estimated, the detection employs optimal Bayesian rule.

Although the invention has in the above been described with reference to the examples in the accompanying drawings, it is obvious that the invention is not restricted thereto but may be varied in many ways within the inventive idea of the attached claims.

I claim:

1. A receiving method in which a received signal comprises several summed signal components, at least some of which being unknown, and the received signal being sampled to produce samples forming an information vector, and in which the received signals are estimated with one or more multidimensional filters (208), characterized in that signal filtering takes place adaptively by forming a model for the signal by means of a cost function which reveals non-linearities in the signal and which is used in optimizing a filter function, and that data contained in the samples of the received signal are detected by means of the optimized filter functions so that prior to the detection the dimension of the information vector is reduced.

2. A method as claimed in claim 1, characterized in that the data transfer employs code division multiple access, and that the initial values of a multidimensional filter are computed by means of filters matched to spreading codes used on each connection.

3. A method as claimed in claim 1 or 2, characterized by performing, prior to filtering, parametric detection for the known part of the signal, and by subtracting this information from the received signal.

4. A method as claimed in claim 3, characterized in that the parametric detection comprises decorrelating detection.

5. A method as claimed in claim 1, characterized in that the cost function reveals non-Gaussian features in the signal.

6. A method as claimed in claim 1, characterized in that the signal model is employed for estimating the density function of at least one signal interfering with the desired signal, and that the estimation of the density function takes place at subspaces determined by the filter functions, and that the detector combines the density functions of the subspaces.

7. A method as claimed in claim 1 or 2, characterized by carrying out a linear transformation for the signal prior to the multidimensional filtering.

8. A method as claimed in claim 7, characterized in that the linear transformation comprises the steps of storing signal samples in a memory element (204), and reading out the samples from the memory element in a different order than in which they were stored.

9. A method as claimed in claim 1, characterized by employing the cost function for finding, for the multidimensional data, a subspace in which the data are non-Gaussian, and by Gaussinizing the data distribution in said subspace.

10. A receiver in a system in which received signals comprise a number of summed signal components of which at least some are unknown, and the receiver comprising a means (202) for sampling the received signal to produce samples and forming an information vector of the samples, and a means (208) for estimating the received signals with one or more multidimensional filters, characterized by comprising a means (208) for forming a model of the received signal by means of a cost function which reveals non-linearities in the signal, and for optimizing the filter function, and a means (208) for detecting data contained in the samples of the received signal by means of the optimized filter functions so that prior to the detection the dimension of the information vector is reduced.

11. A receiver as claimed in claim 10, characterized in that the receiver comprises a means (402) for carrying out adaptive filtering for the signal, a means (404) for whitening the filtered signal, a means (406) for revealing nonlinearities in the signal, a means (408) for computing and updating the density estimate, and a means (410) for generating a new sample by means of the updated density estimate.

12. A receiver as claimed in claim 10, characterized in that the receiver comprises means (204, 206) for carrying out a linear transformation for the sampled signal (210) prior to the multidimensional filtering (208).

13. A receiver as claimed in claim 10, characterized in that the means (208) comprise one or more estimating stages (400, 402).

* * * * *